(12) United States Patent
Kim et al.

(10) Patent No.: US 12,193,262 B2
(45) Date of Patent: Jan. 7, 2025

(54) DISPLAY APPARATUS

(71) Applicant: SAMSUNG DISPLAY CO., LTD., Yongin-si (KR)

(72) Inventors: Sunho Kim, Yongin-si (KR); Sunhee Lee, Yongin-si (KR); Gunhee Kim, Yongin-si (KR); Hyun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 535 days.

(21) Appl. No.: 16/997,101

(22) Filed: Aug. 19, 2020

(65) Prior Publication Data
US 2021/0066661 A1 Mar. 4, 2021

(30) Foreign Application Priority Data

Sep. 3, 2019 (KR) .......................... 10-2019-0108931

(51) Int. Cl.
*H10K 50/844* (2023.01)
*H10K 59/122* (2023.01)
(Continued)

(52) U.S. Cl.
CPC ....... *H10K 50/8445* (2023.02); *H10K 59/122* (2023.02); *H10K 77/111* (2023.02); *H10K 2102/311* (2023.02)

(58) Field of Classification Search
CPC ............ H10K 77/111; H10K 2102/311; H10K 50/8445; H10K 50/8428; H10K 59/8723;
(Continued)

(56) References Cited

U.S. PATENT DOCUMENTS 7,198,832 B2 4/2007 Burrows et al.
8,772,824 B2 7/2014 Lee et al.
(Continued)

FOREIGN PATENT DOCUMENTS

CN 1392615 A 1/2003
KR 10-2002-0097028 A 12/2002
(Continued)

OTHER PUBLICATIONS

Lee, S., et al., "Review of Organic/Inorganic Thin Film Encapsulation by Atomic Layer Deposition for a Flexible OLED Display," JOM, vol. 71, No. 1, 2019, pp. 197-211.

*Primary Examiner* — Caleen O Sullivan
(74) *Attorney, Agent, or Firm* — F. CHAU & ASSOCIATES, LLC

(57) ABSTRACT

A display apparatus includes a substrate having a display area and a peripheral area surrounding the display area. Display elements are arranged in the display area. A spacer is disposed between the display elements and includes a lateral side having a first slope. A thin film encapsulation layer covers the display area and includes a buffer encapsulation layer, an inorganic, encapsulation layer, an organic encapsulation layer, and a composite encapsulation layer sequentially stacked on one another. The composite encapsulation layer includes a plurality of sub-layers stacked on each other. Each of the sub-layers has a thickness that is less than a thickness of the inorganic encapsulation layer. An upper surface of the buffer encapsulation layer has a second slope that is smaller than the first slope. The second slope overlaps the first slope in a direction of a thickness of the substrate.

16 Claims, 9 Drawing Sheets

(51) Int. Cl.
*H10K 77/10* (2023.01)
*H10K 102/00* (2023.01)

(58) Field of Classification Search
CPC ............ H10K 59/122; H10K 59/8731; H10K 59/131; H10K 2102/351; H10K 2102/00; H01L 51/525; H01L 51/5256; H01L 51/0097; H01L 27/3246; H01L 2251/5338
USPC .......................................................... 257/93
See application file for complete search history.

(56) References Cited

U.S. PATENT DOCUMENTS

| | | |
|---|---|---|
| 9,029,846 B2 | 5/2015 | Song et al. |
| 9,153,795 B2 | 10/2015 | Huh et al. |
| 10,079,362 B2 | 9/2018 | Kim et al. |
| 10,797,264 B2 | 10/2020 | Li |
| 2003/0034497 A1* | 2/2003 | Yamazaki ............. H10K 71/00 257/86 |
| 2004/0265508 A9 | 12/2004 | Burrows et al. |
| 2005/0127371 A1 | 6/2005 | Yamazaki et al. |
| 2008/0013100 A1 | 1/2008 | Chang |
| 2008/0315755 A1 | 12/2008 | Han |
| 2015/0014636 A1* | 1/2015 | Kang ................. H10K 50/8428 438/26 |
| 2015/0348803 A1 | 12/2015 | Moro et al. |
| 2016/0204374 A1 | 7/2016 | Sonoda et al. |
| 2017/0018737 A1 | 1/2017 | Kim et al. |
| 2017/0263886 A1 | 9/2017 | Oh et al. |
| 2018/0013100 A1 | 1/2018 | Yim et al. |
| 2019/0096974 A1 | 3/2019 | Kim |
| 2019/0221771 A1 | 7/2019 | Mohan et al. |
| 2019/0393447 A1* | 12/2019 | Yun .................... H10K 50/8445 |

FOREIGN PATENT DOCUMENTS

| | | |
|---|---|---|
| KR | 10-2014-0145463 | 12/2014 |
| KR | 10-2015-0007866 A | 1/2015 |
| KR | 10-2017-0010285 | 1/2017 |
| KR | 10-2018-0005772 A | 1/2018 |
| KR | 10-1912370 | 10/2018 |
| KR | 10-2019-0036617 | 4/2019 |
| WO | 2019153734 | 8/2019 |

* cited by examiner

DISPLAY APPARATUS

CROSS-REFERENCE TO RELATED APPLICATION

This application claims priority under 35 U.S.C. § 119 to Korean Patent Application No. 10-2019-0108931, filed on Sep. 3, 2019 in the Korean Intellectual Property Office, the disclosure of which is incorporated by reference in its entirety herein.

1. Technical Field

One or more embodiments relate to a display apparatus, and more particularly, to a display apparatus including a flexible thin film encapsulation layer.

2. Discussion of Related Art

Flat panel display apparatuses having desirable characteristics such as being thin, light weight, and having low power consumption have been developed. There has been considerable research and development with respect to flexible display apparatuses in the display industry.

Thin and flexible display apparatuses may include a thin film encapsulation layer to prevent the penetration of external moisture or oxygen. The thin film encapsulation layer may have a structure in which inorganic films and organic films are alternately stacked.

SUMMARY

One or more exemplary embodiments include a display apparatus including a flexible thin film encapsulation layer.

However, the above objective is an example, and exemplary embodiments of the present inventive concepts are not limited thereto.

Additional aspects will be set forth in part in the description which follows and, in part, will be apparent from the description, or may be learned by practice of the presented exemplary embodiments of the present inventive concepts.

According to one or more exemplary embodiments of the present inventive concepts, a display apparatus includes a substrate having a display area and a peripheral area surrounding the display area. Display elements are arranged in the display area. A spacer is disposed between the display elements and includes a lateral side having a first slope. A thin film encapsulation layer covers the display area and includes a buffer encapsulation layer, an inorganic encapsulation layer, an organic encapsulation layer, and a composite encapsulation layer sequentially stacked on one another. The composite encapsulation layer includes a plurality of sub-layers stacked on each other. Each of the sub-layers has a thickness that is less than thickness of the inorganic encapsulation layer. An upper surface of the buffer encapsulation layer has a second slope that is smaller than the first slope. The second slope overlaps the first slope in a direction of a thickness of the substrate.

A modulus of the composite encapsulation layer may be less than a modulus of the inorganic encapsulation layer.

The modulus of the composite encapsulation layer may be about 0.05 times to about 0.2 times as much as the modulus of the inorganic encapsulation layer.

The buffer encapsulation layer may include an organic-inorganic hybrid material.

The buffer encapsulation layer may include silicon oxide including carbon.

The composite encapsulation layer may include 1.5 dyads to 10 dyads. In this regard, 1 dyad may be a stack structure of a first sub-layer and a second sub-layer including a different material or a different composition ratio from the first sub-layer.

The display apparatus may further include a capping layer between the display elements and the thin film encapsulation layer, wherein the capping layer may include a refractive index of about to about 3.

The display apparatus may further include a protection layer between the capping layer and the thin film encapsulation layer, wherein the protection layer may include an inorganic material, wherein a refractive index of the protection layer may be smaller less than the refractive index of the capping layer.

The display apparatus may further include an inorganic barrier layer between the display elements and the buffer encapsulation layer, wherein the inorganic barrier layer may include a thickness less than the thickness of the inorganic encapsulation layer.

The thickness of the inorganic barrier layer may be about 500 Å to about 1000 Å.

According to one or more exemplary embodiments of the present inventive concepts, a display apparatus includes a substrate having a display area and a peripheral area surrounding the display area. Display elements are arranged over the display area. A spacer is disposed between the display elements. A capping layer is arranged over the display elements and the spacer. A thin film encapsulation layer is arranged over the capping layer and covers the display area. The thin film encapsulation layer comprises a buffer encapsulation layer, an inorganic encapsulation layer, an organic encapsulation layer, and a composite encapsulation layer sequentially stacked on one another. The composite encapsulation layer comprises a plurality of sub-layers stacked on each other. Each of the sub-layers has a thickness that is less than a thickness of the inorganic encapsulation layer. An upper surface of the buffer encapsulation layer is flat.

The display apparatus may further include a protection layer between the capping layer and the buffer encapsulation layer, wherein the protection layer may include an inorganic material, wherein a refractive index of the protection layer may be less than a refractive index of the capping layer.

The protection layer may include lithium fluoride (LiF).

The display apparatus may further include an inorganic barrier layer between the capping layer and the flier encapsulation layer, wherein a thickness of the inorganic barrier layer may be less than the thickness of the inorganic encapsulation layer.

The thickness of the inorganic barrier layer may be about 500 □ to about 1000 □.

A modulus of the composite encapsulation layer may be less than a modulus of the inorganic encapsulation layer.

A modulus of the composite encapsulation layer may be about 0.05 times to about 0.2 times as much as a modulus of the inorganic encapsulation layer.

The buffer encapsulation layer may include an organic material.

The composite encapsulation layer may include 1.5 dyads to 10 dyads. In this regard, 1 dyad may be a stack structure of a first sub-layer and a second sub-layer including a different material or a different composition ratio from the first sub-layer.

According to one or more exemplary embodiments of the present inventive concepts, a display apparatus includes a substrate having a display area and a peripheral area surrounding the display area. Display elements are arranged in the display area. A thin film encapsulation layer covers the display area. The thin film encapsulation layer comprises an inorganic encapsulation layer, an organic encapsulation layer, and a composite encapsulation layer sequentially stacked on one another. The composite encapsulation layer comprises a plurality of sub layers stacked on each other and a thickness of the composite encapsulation layer is less than a thickness of the inorganic encapsulation layer.

The thin film encapsulation layer may further include a buffer encapsulation layer between the display elements and the inorganic encapsulation layer, wherein the buffer encapsulation layer may include an organic material or an organic-inorganic hybrid material.

The buffer encapsulation layer may include $SiO_xC_yH_z$ (x>0, y>0, z≥0).

The display apparatus may further include a capping layer between the display elements and the thin film encapsulation layer, wherein the capping layer may include a refractive index of about 1.6 to about 3.

The display apparatus may further include a protection layer between the capping layer and the thin film encapsulation layer, wherein the protection layer may include an inorganic material, wherein a refractive index of the protection layer may be less than the refractive index of the capping layer.

The plurality of sub-layers may include a first sub-layer and a second sub-layer alternately stacked on each other, wherein the first sub-layer may include an inorganic film, and the second sub-layer may include an organic-inorganic hybrid material.

According to one or more exemplary embodiments of the present inventive concepts, a flexible display apparatus includes a flexible substrate including a display area and a peripheral area surrounding the display area. Display elements are arranged in the display area. A spacer is disposed between the display elements. The spacer includes a lateral side having a first slope. A thin film encapsulation layer covers the display area. The thin film encapsulation layer includes a buffer encapsulation layer disposed above the display area and an inorganic encapsulation layer disposed above the buffer encapsulation layer. The buffer encapsulation layer comprises an organic material or an organic-inorganic hybrid material. An upper surface of the buffer encapsulation layer has a second slope that is smaller than the first slope. The second slope overlaps the first slope in a direction of a thickness of the substrate.

BRIEF DESCRIPTION OF THE DRAWINGS

The above and other aspects, features, and advantages of certain exemplary embodiments of the present inventive concepts will be more apparent from the following description taken in conjunction with the accompanying drawings, in which.

DETAILED DESCRIPTION OF EXEMPLARY EMBODIMENTS

Figure 1A:
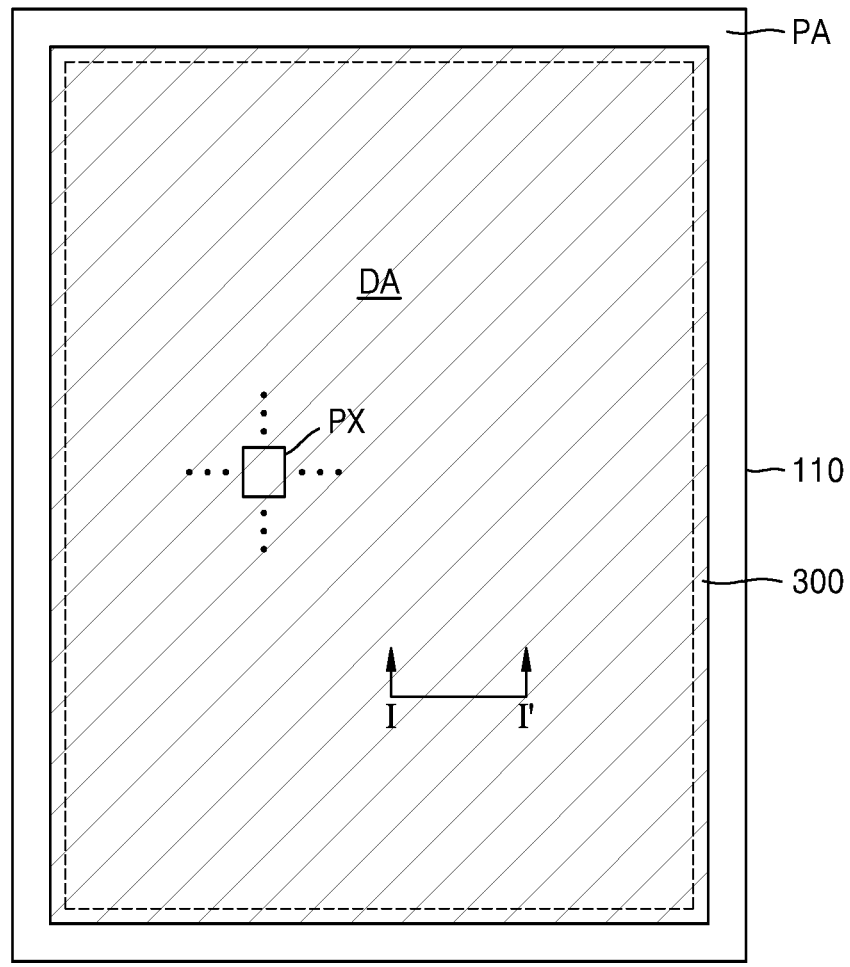
FIG. 1A is a top plan view of a display apparatus according to an exemplary embodiment of the present inventive concepts.

Reference will now be made in detail to exemplary embodiments of the present inventive concepts, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, exemplary embodiments will be described in detail with reference to the accompanying drawings, wherein like reference numerals refer to like elements throughout and a repeated description thereof is omitted.

While such terms as "first" and "second" may be used to describe various components, such components must not be limited to the above terms. The above terms are used only to distinguish one component from another.

The singular forms "a," "an," and "the" as used herein are intended to include the plural forms as well, unless the context clearly indicates otherwise.

It will be understood that the terms "comprise," "include," and "have" as used herein specify the presence of stated features or components but do not preclude the presence or addition of one or more other features or components.

It will be further understood that, when a layer, region, or component is referred to as being "on" another layer, region, or component, it can be directly or indirectly on the other layer, region, or component. That is, for example, intervening layers, regions, or components may be present. However, when a layer, region, or component is referred to as being "directly on" another layer, region, or component, no intervening layers, regions, or components may be present.

Sizes of components in the drawings may be exaggerated or reduced for convenience of explanation. For example, since sizes and thicknesses of components in the drawings are arbitrarily illustrated for convenience of explanation, and exemplary embodiments of the present inventive concepts are not limited thereto.

When an exemplary embodiment may be implemented differently, a certain process order may be performed differently from the described order. For example, two consecutively described processes may be performed substantially at the same time or performed in an order opposite to the described order.

When layers, regions, or components are "connected," the layers, regions, or components may not only be "directly connected" but may also be "indirectly connected" via another layer, region, or component. For example, in the present description, when layers, regions, or components are electrically connected, the layers, regions, or components may not only be directly electrically connected but may also be indirectly electrically connected via another layer, region, or component.

Figure 1B:
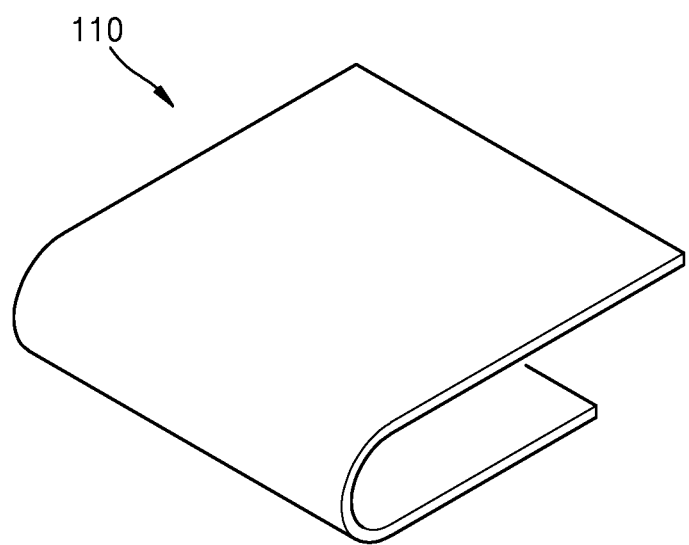
FIG. 1B is a perspective view of a substrate of a flexible display apparatus in a bent configuration according to an exemplary embodiment of the present inventive concepts.

FIG. 1A is a top plan view of a display apparatus according to an exemplary embodiment of the present inventive concepts. FIG. 1B is a perspective view of a substrate of a flexible display apparatus in a bent configuration according to an exemplary embodiment of the present inventive concepts.

Referring to FIG. 1A, the substrate 110 may be divided into a display area DA on which an image is displayed and a peripheral area PA, which is arranged around the display area DA (e.g., surrounding the display area DA in the X and/or Y directions that are directions parallel an upper surface of the substrate 110 and that cross each other).

In an exemplary embodiment, the substrate 110 may include various materials such as glass, metal, or plastic. According to an exemplary embodiment of the present inventive concepts, the substrate 110 may include a flexible material. In this regard, the flexible material refers to a substrate which bends and may be foldable or callable. In an exemplary embodiment, the substrate 110 including the flexible material may include ultra-thin glass, metal, or plastic.

As shown in the exemplary embodiment of FIG. 1B, a portion of the substrate 110 may be bent to have a curvature. In an embodiment, a bendable portion of the substrate 110 may include the display area DA. In another exemplary embodiment, a bendable portion of the substrate 110 may be arranged in the peripheral area PA. In other exemplary embodiments, the bendable portion of the substrate 110 may be arranged in both the display area DA and the peripheral area PA. Also, the substrate 110 may be rolled up or be folded and unfolded.

Pixels PX including various display elements such as an organic light-emitting diode OLED may be arranged in the display area DA of the substrate 110. Each pixel PX may emit, for example, red, green, blue, or white light, via the organic light-emitting diode OLED. A pixel PX described herein may be understood as a pixel which emits one of red light, green light, blue light, and white light as described above. The pixel PX may include a plurality of pixels, and emission regions of the plurality of pixels PX may be arranged in various forms such as stripe arrangement, Pen-Tile arrangement, mosaic arrangement, etc. to display an image.

The pixel PX may further include a plurality of thin film transistors. For example, first and second thin film transistors TFT1 and TFT2, for controlling a display element and a storage capacitor Cst. However, the number of thin film transistors, for example, the first and second thin film transistors TFT1 and TFT2, included in one pixel may be variously modified. For example, in an exemplary embodiment of the present inventive concepts, the number of thin film transistors may be between two to seven. However, exemplary embodiments of the present inventive concepts are not limited thereto.

As shown in the exemplary embodiment of FIG. 1A, the display area DA may have a rectangular shape (e.g., extending in the X direction and Y direction). However, exemplary embodiments of the present inventive concepts are not limited thereto. For example, in another exemplary embodiment, the display area DA may have a polygonal shape such as a triangular shape, a pentagonal shape, a hexagonal shape, etc. or a circular shape, an oval shape, an atypical shape, etc.

The peripheral area PA of the substrate 110, which is an area arranged around the display area DA (e.g., surrounding the display area DA), may be an area where no image is displayed. Various wires for transmitting electrical signals which will be applied to the display area DA, an embedded circuit portion for generating some signals, pads to which a printed circuit board or a driver integrated circuit (IC) chip is attached may be located in the peripheral area PA. In the exemplary embodiment of FIG. 1A, the peripheral area PA is disposed around four sides of the rectangular-shaped display area DA. However, exemplary embodiments of the present inventive concepts are not limited thereto. In other exemplary embodiments, the display area DA may extend to at least one edge of the substrate 110 and a peripheral area PA may not surround at least one side of the display area DA.

A thin film encapsulation layer 300 may be arranged to cover the display area DA of the substrate 110. The thin film encapsulation layer 300 may cover the display area DA and a portion of the peripheral area PA. The thin film encapsulation layer 300 is a component for protecting display elements in the display area DA. The thin film encapsulation layer 300 may prevent penetration of external contaminants such as moisture, etc. into a display element or a pixel circuit for driving a display element.

When the substrate 110 has a bent configuration as shown in FIG. 1B, the thin film encapsulation layer 300 arranged thereon may also be bent according to a shape of the substrate 110. When the thin film encapsulation layer 300 is bent, stress may concentrate on the thin film encapsulation layer 300.

Although for convenience of explanation, an organic light-emitting display apparatus is described below as an example of a display element for the display apparatus, exemplary embodiments of the present inventive concepts are not limited thereto. For example, in another exemplary embodiment, the display apparatus may include various of display elements such as an inorganic light-emitting display, a quantum dot light-emitting display, a liquid crystal display, etc.

Hereinafter, components included in a display apparatus according to one or more exemplary embodiments will be described in detail with reference to FIGS. 2 to 5.

Figure 2:
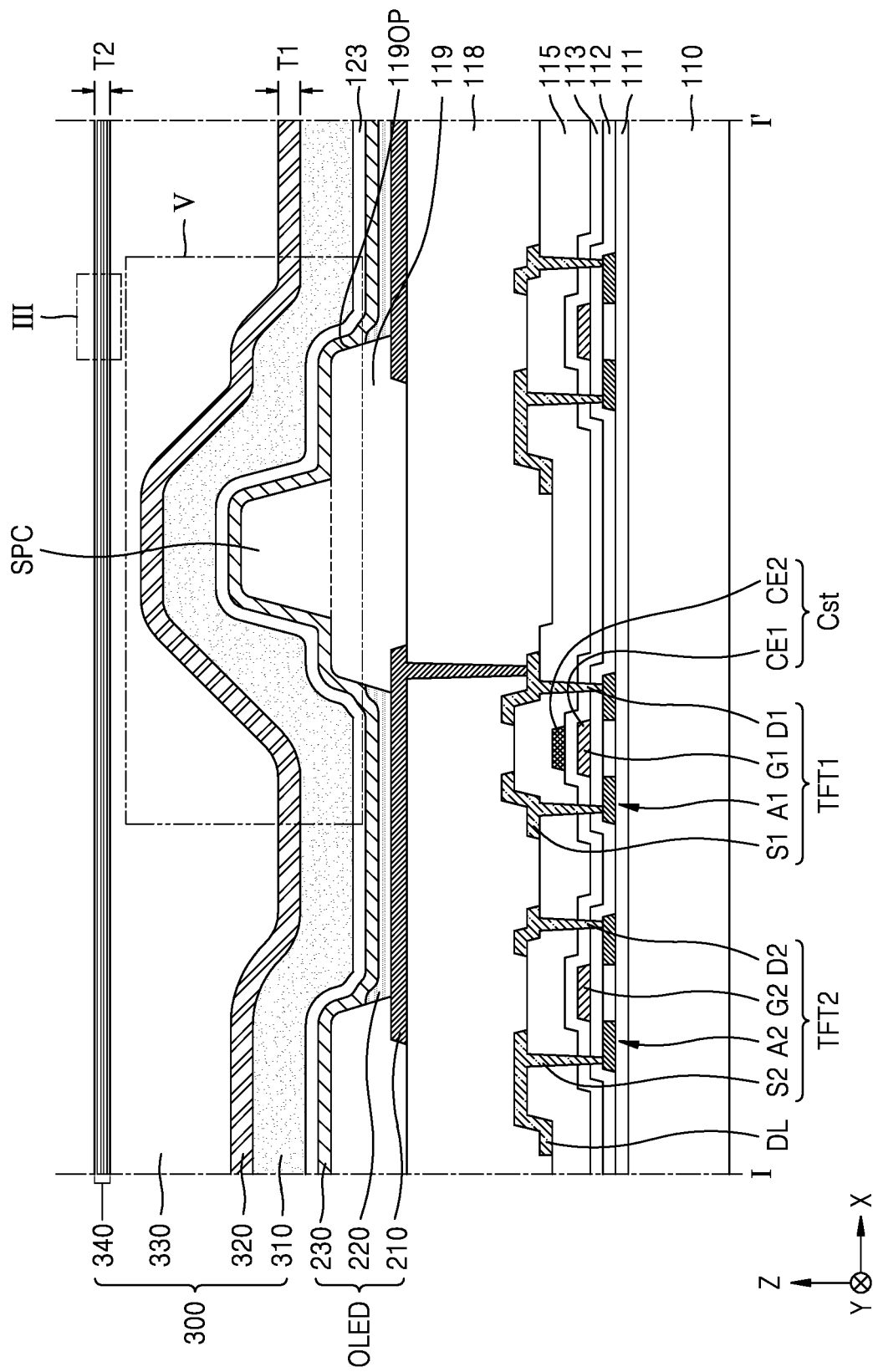
FIG. 2 is a cross-sectional view of the display apparatus taken along line I-I' of FIG. 1 according to an exemplary embodiment of the present inventive concepts.
Figure 3:
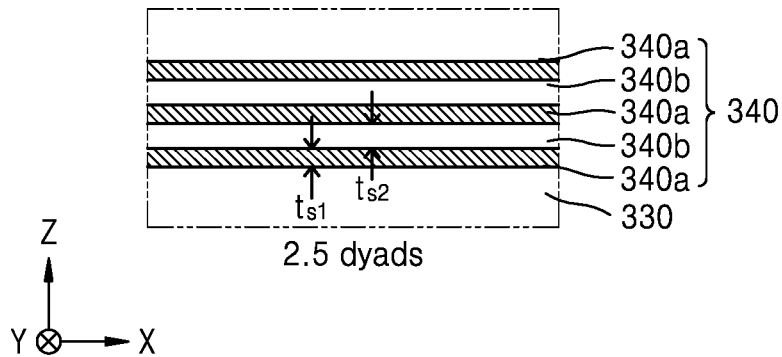
FIG. 3 is an enlarged cross-sectional view of region III of FIG. 2 according to an exemplary embodiment of the present inventive concepts.
Figure 4A:
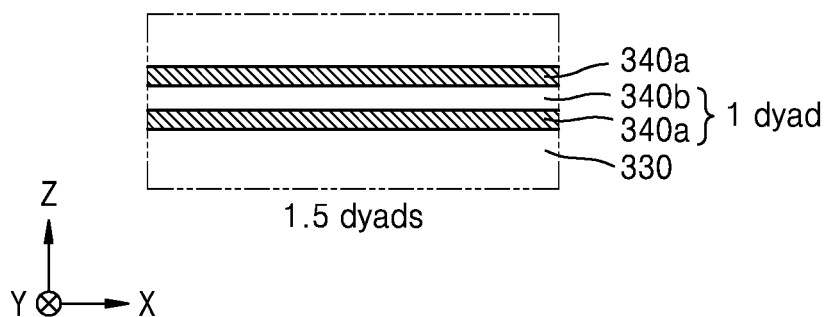
FIG. 4A is a cross-sectional view of a composite encapsulation layer according to an exemplary embodiment of the present inventive concepts.
Figure 4B:
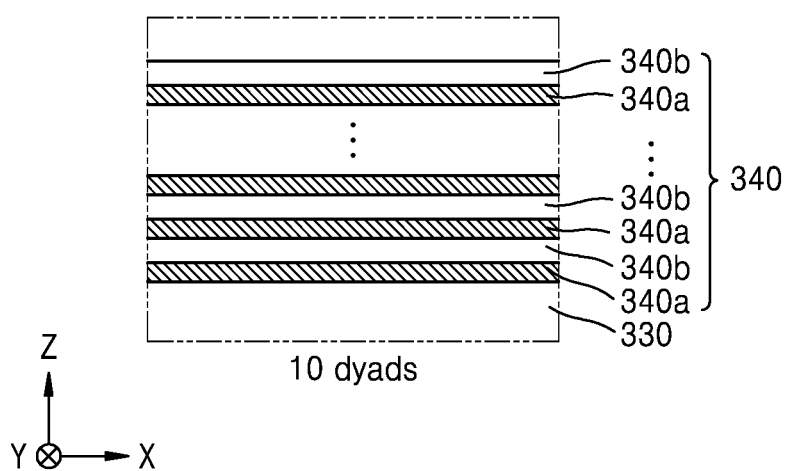
FIG. 4B is a cross-sectional view of another composite encapsulation layer according to an exemplary embodiment of the present inventive concepts.
Figure 5:
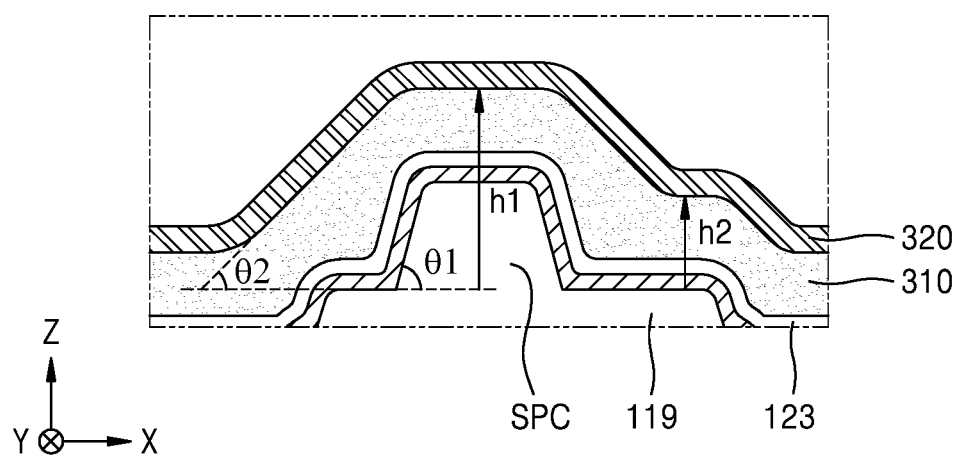
FIG. 5 is an enlarged cross-sectional view of region V of FIG. 2 according to an exemplary embodiment of the present inventive concepts.

FIG. 2 is a schematic cross-sectional view of the display apparatus taken along line of FIG. 1 according to an exemplary embodiment of the present inventive concepts. FIG. 3 is an enlarged cross-sectional view of region of FIG. 2 and shows a portion of a composite encapsulation layer according to an exemplary embodiment of the present inventive concepts. FIG. 4A is an enlarged cross-sectional view of an example of a composite encapsulation layer applicable to exemplary embodiments of the present inventive concepts. FIG. 4B is an enlarged cross-sectional view of an example of a composite encapsulation layer applicable to exemplary embodiments of the present inventive concepts. FIG. 5 is an enlarged diagram of region V of FIG. 2 and shows a relationship between a spacer and a buffer encapsulation layer.

Referring to FIG. 2, a display apparatus according to an exemplary embodiment of the present inventive concepts includes the substrate 110, the organic light-emitting diode OLED arranged above the substrate 110 and serving as a display element, a spacer SPC, and the thin film encapsulation layer 300. In an exemplary embodiment, the thin film encapsulation layer 300 may include a buffer encapsulation layer 310, an inorganic encapsulation layer 320, an organic encapsulation layer 330, and a composite encapsulation layer 340.

The substrate 110 may include various materials such as glass, metal, or plastic. According to an exemplary embodiment of the present inventive concepts, the substrate 110 may be a flexible substrate and may include, for example, a polymer resin, such as at least one compound selected from polyethersulfone, polyacrylate, polyetherimide, polyethylene naphthalate, polyethylene terephthalate, polyphenylene sulfide, polyarylate, polyimide, polycarbonate, and cellulose acetate propionate. However, exemplary embodiments of the present inventive concepts are not limited thereto.

A buffer layer 111 may be located on the substrate 110 and thus may decrease or prevent penetration of foreign materials, moisture, or external air from the bottom of the substrate 110 and may provide a flat surface on the substrate 110. In an exemplary embodiment, the buffer layer 111 may include an inorganic material such as an oxide or nitride, an organic material, or an organic-inorganic complex material and may have a single-layer or multilayer structure including an inorganic material and an organic material. As shown in the exemplary embodiment of FIG. 2, the buffer layer 111 may be disposed directly on the substrate 110 (e.g., in the Z direction which is in a direction of the thickness of the substrate 110 and is perpendicular to the X direction and Y direction). However, exemplary embodiments of the present inventive concepts are not limited thereto. For example, in another exemplary embodiment, a barrier layer for preventing penetration of external air may be further disposed between the substrate 110 and the buffer layer 111 (e.g., in the Z direction).

The first thin film transistor TFT1 may include a first semiconductor layer A1, a first gate electrode G1, a first source electrode S1, and a first drain electrode D1, and the second thin film transistor TFT2 may include a second semiconductor layer A2, a second gate electrode G2, a second source electrode S2, and a second drain electrode D2. In an exemplary embodiment, the first thin film transistor TFT1 may be connected to the organic light-emitting diode OLED to serve as a driving thin film transistor for driving the organic light-emitting diode OLED. The second thin film transistor TFT2 may be connected to a data line DL to serve as a switching thin film transistor. Although the exemplary embodiment of FIG. 2 includes two thin film transistors, exemplary embodiments of the present inventive concepts are not limited thereto.

In an exemplary embodiment, the first semiconductor layer A1 and the second semiconductor layer A2 may each include amorphous silicon or polycrystalline silicon. In another exemplary embodiment, the first and second semiconductor layers A1 and A2 may each include oxide of at least one material selected from the group including indium (In), gallium (Ga), stannum zirconium (Zr), vanadium (V), hafnium (Hf), cadmium (Cd), germanium (Ge), chromium (Cr), titanium (Ti), and zinc (Zn). The first and second semiconductor layers A1 and A2 may each include a channel region and source and drain regions doped with impurities. The channel region, the source region and the drain region of the first and second semiconductor layers A1 and A2 may be arranged in the X direction.

The first gate electrode G1 and the second gate electrode G2 may be arranged over the first semiconductor layer A1 and the second semiconductor layer A2, respectively, with a first gate insulating layer 112 therebetween (e.g., in the Z direction). In an exemplary embodiment, the first gate electrode G1 and the second gate electrode G2 may each include at least one compound selected from molybdenum (Mo), aluminum (Al), copper (Cu), titanium (Ti), etc. and may each have a single-layer or multilayer structure. For example, the first gate electrode G1 and the second gate electrode G2 may each include a single Mo layer.

In an exemplary embodiment, the first gate insulating layer 112 may include at least one compound selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). However, exemplary embodiments of the present inventive concepts are not limited thereto.

A second gate insulating layer 113 may be provided to cover the first gate electrode G1 and the second gate electrode G2. For example, as shown in the exemplary embodiment of FIG. 2, the second gate insulating layer 113 may be disposed directly on the first gate insulating layer 112, the first gate electrode G1 and the second gate electrode G2 (e.g., in the Z direction). In an exemplary embodiment, the second gate insulating layer 113 may include at least one compound selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

A first electrode CE1 of the storage capacitor Cst may overlap the first thin film transistor TFT1 (e.g., in the Z direction). For example, as shown in the exemplary embodiment of FIG. 2, the first gate electrode G1 of the first thin film transistor TFT1 may serve as the first electrode CE1 of the storage capacitor Cst. However, exemplary embodiments of the present inventive concepts are not limited thereto.

As shown in the exemplary embodiment of FIG. 2, a second electrode CE2 of the storage capacitor Cst overlaps the first electrode CE1 with the second gate insulating layer 113 therebetween (e.g., in the Z direction). In this embodiment, the second gate insulating layer 11 may serve as a dielectric layer of the storage capacitor Cst. In an exemplary embodiment, the second electrode CE2 may include a conductive material including at least one compound selected from molybdenum (Mo), alumina (Al), copper (Cu), titanium (Ti), etc. and may have a single-layer or multilayer structure including the material described above. For example, the second electrode CE2 may include a single Mo layer or have a multilayer structure of Mo/Al/Mo.

The first source and drain electrodes S1 and D1 and the second source and drain electrodes S2 and D2 may be arranged on an interlayer insulating layer 115. For example, as shown in the exemplary embodiment of FIG. 2, the interlayer insulating layer 115 may be disposed directly on the second gate insulating layer 113 (e.g., in the Z direction) and the first source and drain electrodes S1 and D1 may be disposed directly on the interlayer insulating layer (e.g., in the Z direction). Each of the first source and drain electrodes S1 and D1 and the second source and drain electrodes S2 and D2, respectively, may be spaced apart in the X direction. However, exemplary embodiments of the present inventive concepts are not limited thereto. The first source and drain electrodes S1 and D1 and the second source and drain electrodes S2 and D2 may each include a conductive material including at least one compound selected from molybdenum (Mo), aluminum (Al), copper (Cu), titanium (Ti), etc. and may each have a single-layer or multilayer structure including the material described above. For example, the first source and drain electrodes S1 and D1 and the second source and drain electrodes S2 and D2 may each have a multilayer structure of Ti/Al/Ti.

A planarization layer 118 may be located over the first source and drain electrodes S1 and D1 and the second source and drain electrodes S2 and D2, the organic light-emitting diode OLED may be located on the planarization layer 118. For example, as shown in the exemplary embodiment of FIG. 2, the planarization layer 118 may be disposed directly on the first source and drain electrodes S1 and D1 and the second source and drain electrodes S2 and D2 (e.g., in the Z direction), and the organic light-emitting diode OLED may be disposed directly on the planarization layer 118 (e.g., in the Z direction).

The planarization layer 118 may have a flat upper surface (e.g., extending substantially in the X direction) so that a pixel electrode 210 disposed thereon may be flat. The planarization layer 118 may have a single-layer or multilayer structure including a film including an organic material. In an exemplary embodiment, the planarization layer 118 may include a general-purpose polymer such as at least one compound selected from benzocyclobutene (BCB), polyimide, poly(methyl methacrylate) (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend, thereof.

The organic light-emitting diode OLED is arranged on the planarization layer 118 (e.g., in the Z direction). For example, a bottom surface of the organic light-emitting diode OLED may directly contact the top surface of the planarization layer 118. The organic light-emitting diode OLED includes the pixel electrode 210, an intermediate layer 220 including an organic emission layer, and an opposite electrode 230. For example, as shown in the exemplary embodiment of FIG. 2, the intermediate layer 220 may be disposed directly on the pixel electrode (e.g., in the Z direction) and the opposite electrode 230 may be disposed directly on the intermediate layer 220 (e.g., in the Z direction).

The planarization layer 118 may include a via hole exposing one of the first source electrode S1 and the first drain electrode D1 of the first thin film transistor TFT1, and the pixel electrode 210 may contact the first source electrode S1 or the first drain electrode D1 via the via hole and thus may be electrically connected to the first thin film transistor TFT1.

The pixel electrode 210 may include a light-transmitting electrode or a reflective electrode. In an exemplary embodiment, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent or semi-transparent electrode layer on the reflective film. The transparent or semi-transparent electrode layer may include at least one compound selected from the group including indium tin oxide (ITO), indium zinc oxide (IZO), zinc oxide (ZnO), indium oxide ($In_2O_3$), indium gallium oxide (IGO), and aluminum zinc oxide (AZO).

A pixel-defining film 119 may be arranged on the planarization layer 118. For example, as shown in the exemplary embodiment of FIG. 2, the pixel-defining film 119 may be disposed directly on the planarization layer 118 and on lateral edges of the pixel electrode 210 (e.g., in the Z direction). The pixel-defining film 119 may have an opening 119OP corresponding to each pixel. The opening 119OP exposes at least a central portion of the pixel electrode 210 and thus may define an emission region of the pixel. The pixel-defining film 119 may prevent the occurrence of an arc over the edge of the pixel electrode 210 by increasing a distance between the edge of the pixel electrode 210 and the opposite electrode 230 arranged over the pixel electrode 210. In an exemplary embodiment, the pixel-defining film 11 may be formed by a method such as spin coating, using one or more organic insulating materials selected from the group including polyimide, polyamide, acrylic resin, BCB, and phenolic resin.

The spacer SPC may be arranged on the pixel-defining film 119. For example, as shown in the exemplary embodiment of FIG. 2, the spacer SPC may be disposed directly on the pixel-defining film 119 (e.g., in the Z direction). The spacer SPC may be arranged between a plurality of display elements (e.g., between the organic light-emitting diode OLED formed by the pixel electrode 210, the intermediate layer 220 and the opposite electrode 230 in the X direction) and may protrude in a direction away from the substrate 110 (e.g. the Z direction). In an exemplary embodiment, the spacer SPC may be a component for preventing an imprint during a mask process. In another exemplary embodiment, the spacer SPC may change an optical path. In an exemplary embodiment, the spacer SPC may be formed by a method such as spin coating, using one or more organic insulating materials selected from the group including polyimide, polyamide, acrylic resin, BCB, and phenolic resin. In some exemplary embodiments, the spacer SPC may include the same material as the pixel-defining film 119 and may be formed simultaneously with the pixel-defining film 119 by a process that utilizes a halftone mask.

The intermediate layer 220 of the organic light-emitting; diode OLED may include an organic emission layer. In an exemplary embodiment, the organic emission layer may include an organic material including a fluorescent or phosphorescent material which emits red light, green light, blue light, or white light. In are exemplary embodiment, the organic emission layer may include a low molecular weight organic material or a polymer organic material, and functional layers such as a hole transport layer (HTL), a hole injection layer (HIL), an electron transport layer (ETI), and an electron injection layer (EIL) may be selectively further arranged under and on the organic emission layer. In some exemplary embodiments, the intermediate layer 220 may correspond to each of a plurality of pixel electrodes 210. In another exemplary embodiment, the intermediate layer 220 may include an integral layer over the plurality of pixel electrodes 210. For example, the organic emission layer may correspond to each of the plurality of pixel electrodes 210, and a functional layer disposed on and/or under the organic emission layer may be integrally provided over a plurality of pixels. In another exemplary embodiment, the intermediate layer 220 may be integrally provided over the plurality of pixel electrodes 210.

The opposite electrode 230 may include a light-transmitting electrode or a reflective electrode. In some exemplary embodiments, the opposite electrode 230 may include a transparent or semi-transparent electrode and may include a metallic thin film having a low work function and including Li, Ca, LiFi/Ca, LiF/Al, Al, Ag, Mg, and a compound thereof. Also a transparent conductive oxide (TCO) film such as ITO, WO, ZnO, or $In_2O_3$ may be further arranged on the metallic thin film. In an exemplary embodiment, the opposite electrode 230 may extend (e.g., in the X direction) across a plurality of pixels and may be integrally formed in a plurality of organic light-emitting diodes OLED to correspond to the plurality of pixel electrodes 210.

In an exemplary embodiment, a capping layer 123 may be arranged over the opposite electrode 230. For example, as shown in the exemplary embodiment of FIG. 2, the capping layer 123 may be disposed directly on the opposite electrode 230 (e.g., in the Z direction). The capping layer 123 may be disposed on the opposite electrode 230 and thus may protect the organic light-emitting diode OLED. The capping layer 123 may also assist in providing an efficient emission of light generated from the organic light-emitting diode OLED. For example, the capping layer 123 may include an organic material such as a-NPD, NPB, TPD, m-MTDATA, $Alq_3$, or CuPc. In an exemplary embodiment, a refractive index of the capping layer 123 may range from about 1.6 to about 3.0.

The thin film encapsulation layer 300 may be arranged over the capping layer 123 to seal the plurality of organic light-emitting diodes OLED. For example, as shown in the exemplary embodiment of FIG. 2, a bottom surface of the thin film encapsulation layer 300 may be disposed directly on a top surface of the capping layer 123. As shown in the exemplary embodiment of FIG. 2, the thin film encapsulation layer 300 may include the buffer encapsulation layer 310, the inorganic encapsulation layer 320, the organic encapsulation layer 330, and the composite encapsulation layer 340 sequentially stacked on one another (e.g., in the Z direction).

The composite encapsulation layer 340 may include a plurality of sub-layers 340a and 340b stacked on each other (e.g., in the Z direction). Each of the plurality of sub-layers 340a and 340b of the composite encapsulation layer 340 has a thickness (e.g., length in the Z direction) that is less than a thickness T1 of the inorganic encapsulation layer 320. For example, in an exemplary embodiment, a total thickness T2 of the composite encapsulation layer 340 may be less than the thickness T1 of the inorganic encapsulation layer 320. The respective thicknesses of the sub-layers 340a and 340b included in the composite encapsulation layer 340 may be very small and the composite encapsulation layer 340 may be densely formed. Therefore, although the composite encapsulation layer 340 includes the plurality of sub-layers 340a and 340b, the total thickness T2 of the composite encapsulation layer 340 may be less than the total thickness T1 of the single-layered inorganic encapsulation layer 320.

The inorganic encapsulation layer 320 may be introduced to prevent the occurrence of a crack, such as in instances of a shape change when the thin film encapsulation layer 300 is bent as the user bends the substrate 110. In an exemplary embodiment, a modulus (e.g., a bending modulus) of the composite encapsulation layer 340 may be less than the modulus of the inorganic encapsulation layer 320. For example, in an exemplary embodiment, a modulus of the composite encapsulation layer 340 may be about 0.05 times to about 0.2 times (e.g., in a range of about 5% to about 20%) as much as that of the inorganic encapsulation layer 320. In an exemplary embodiment, a modulus of the composite encapsulation layer 340 may be about 6 GPa to about 10 GPa. A modulus of the inorganic encapsulation layer 320 may be about 60 GPa to about 100 GPa.

When a display area of a display apparatus has a curved surface, an uppermost layer of the thin film encapsulation layer 300 may be subject to more stress compared to other layers and thus may crack. In the present exemplary embodiment, the composite encapsulation layer 340 having a small modulus may be introduced to the uppermost layer of the thin film encapsulation layer 300 to prevent or decrease the occurrence of a crack in the uppermost layer of the thin film encapsulation layer 300. The composite encapsulation layer 340 will be described in more detail below.

Since the inorganic encapsulation layer 320 is closer to the substrate 110 (e.g., in the Z direction) than the composite encapsulation layer 340, stress caused by a curvature (e.g., bending) of the display device may have a relatively small effect on the inorganic encapsulation layer 320. However, the inorganic encapsulation layer 320 is formed according to shapes of elements arranged under the inorganic encapsulation layer 320 (e.g., in the Z direction). Therefore, the inorganic encapsulation layer 320 may be influenced by stress caused by a member forming a step, for example, the spacer SP, which is positioned under the inorganic encapsulation layer 320 (e.g., in the Z direction).

In an exemplary embodiment of the present inventive concepts, the buffer encapsulation layer 310 is introduced to prevent such stress from being concentrated on the inorganic encapsulation layer 320.

The buffer encapsulation layer 310 may be arranged between the organic light-emitting diode OLED, which is a display element, and the inorganic encapsulation layer 320 (e.g., in the Z direction). For example, as shown in the exemplary embodiment of FIG. 2, a bottom surface of the buffer encapsulation layer 310 directly contacts a top surface of the capping layer 123 and a top surface of the buffer encapsulation layer 310 directly contacts a bottom surface of the inorganic encapsulation layer 320. The buffer encapsulation layer 310 decreases a step formed by a step portion such as the spacer SPC. For example, as shown in the exemplary embodiment of FIG. 5 in which a region of the spacer SPC is enlarged, a portion of an upper surface of the buffer encapsulation layer 310 may have a slope with a tilt angle $\theta 2$ (e.g., with respect to the X direction) that is gentler (e.g., smaller) than a tilt angle $\theta 1$ of a lateral side of the spacer SPC (e.g., with respect to the X direction). The portion of the upper surface of the buffer encapsulation layer 310 having the gentler slope with a tilt angle $\theta 2$ may overlap the lateral side of the spacer SPC having the tilt angle $\theta 1$ (e.g., in the Z direction).

Since the buffer encapsulation layer 310 may be formed to decrease a step formed by the spacer SPC, the buffer encapsulation layer 310 may have a first height h1 (e.g., length in the Z direction) corresponding to the center of the spacer SPC and a second height h2 corresponding to the periphery of the spacer SPC that is less than the first height h1.

In an exemplary embodiment, the buffer encapsulation layer 310 may include an organic-inorganic hybrid material. For example, the buffer encapsulation layer 310 may include silicon oxide including carbon or silicon oxide including carbon and hydrogen. In an exemplary embodiment, the buffer encapsulation layer 310 may include a material having a composition formula of $SiO_xC_yH_x$, wherein x>0, y>0, z≥0. As a composition ratio of x increases, the buffer encapsulation layer 310 may have qualities similar to an inorganic film, and as a composition ratio of y increases, the buffer encapsulation layer 310 may have qualities similar to an organic film.

In an exemplary embodiment of the present inventive concepts, a composition ratio of y may be increased to allow the buffer encapsulation layer 310 to have qualities similar to an organic film. Accordingly, the buffer encapsulation layer 310 may have flowable and flexible characteristics and thus may have a slope that is gentler (e.g., smaller) than the slope of the spacer SPC. The organic-inorganic hybrid material of the buffer encapsulation layer 310 has low outgassing or moisture permeability compared to an organic material such as a monomer. Therefore, a change in characteristics of the organic light-emitting diode OLED due to the buffer encapsulation layer 310 may decrease.

In an exemplary embodiment, based on a total number of atoms of silicon, oxygen, and carbon, the buffer encapsulation layer 310 may include about 20 atomic % to about 50 atomic % of silicon, about 10 atomic % to about 40 atomic % of oxygen, and about 30 atomic % to about 60 atomic % of carbon. In another exemplary embodiment, the buffer encapsulation layer 310 may include about 30 atomic % to about 40 atomic % of silicon, about 18 atomic % to about 28 atomic % of oxygen, and about 40 atomic % to about 50 atomic % of carbon. In another exemplary embodiment, the buffer encapsulation layer 310 may include about 33 atomic % to about 36 atomic % of silicon, about 20 atomic % to about 23 atomic % of oxygen, and about 42 atomic % to about 45 atomic % of carbon. In this regard, a ratio of oxygen to silicon (O/Si) may be equal to or greater than 0.4 and less than or equal to 1.

In an exemplary embodiment, the buffer encapsulation layer 310 may be formed by plasma enhanced chemical vapor deposition (PECVD). For example, a source gas may be hexamethyldisiloxane, and a reaction gas may be $N_2O$. For example, when hexamethyldisiloxane is used as a source gas, and $N_2O$ having a low flow rate is used at low power, hexamethyldisiloxane may be formed into SiOxCyHz having qualities of an organic film.

The inorganic encapsulation layer 320 is arranged on the buffer encapsulation layer 310. For example, as shown in the exemplary embodiment of FIG. 2, a bottom surface of the inorganic encapsulation layer 320 may directly contact a top surface of the buffer encapsulation layer 310. In an exemplary embodiment, the inorganic encapsulation layer 320 may include at least one compound selected from ceramic, metal oxide, metal nitride, metal carbide, metal oxynitride, indium oxide ($In_2O_3$), tin oxide ($SnO_2$), indium tin oxide (ITO), silicon oxide ($SiO_x$), silicon nitride ($SiN_x$) and/or silicon oxynitride (SiON). However, exemplary embodiments of the present inventive concepts are not limited thereto. The inorganic encapsulation layer 320 may be arranged on the buffer encapsulation layer 310. Stress caused by a step of the spacer SPC, such as when the display apparatus is bent, may have only a little influence on the inorganic encapsulation layer 320 due to the buffer encapsulation layer 310. The inorganic encapsulation layer 320 by its nature is formed according to a shape of a lower structure, and thus, an upper surface of the inorganic encapsulation layer 320 may not be flat.

The organic encapsulation layer 330 may cover the inorganic encapsulation layer 320. For example, as shown in the exemplary embodiment of FIG. 2, a bottom portion of the organic encapsulation layer 330 may contact a top portion of the inorganic encapsulation layer 320. The organic encapsulation layer 330, unlike the inorganic encapsulation layer 320, may be substantially flat. For example, the organic encapsulation layer 130 may have a substantially flat upper surface at a portion corresponding to the display area DA. In an exemplary embodiment, the organic encapsulation layer 330 may include one or more materials selected from the group including acrylic, methacrylic, polyester, polyethylene, polypropylene, polyethylene terephthalate (PET), polyethylene naphthalate, polycarbonate, polyimide, polyethylene sulfonate, polyoxymethylene, and polyarylate.

The composite encapsulation layer 340 is arranged on the organic encapsulation layer 330. For example, as shown in the exemplary embodiment of FIG. 2, a bottom surface of the composite encapsulation layer 340 may directly contact a top surface of the organic encapsulation layer 330. The composite encapsulation layer 340 will be described below with reference to FIGS. 3 to 4B.

The composite encapsulation layer 340 may include the plurality of sub-layers 340a and 340b stacked on each other (e.g., in the Z direction). The plurality of sub-layers 340a and 340b are layers distinct from each other. For example, the plurality of sub-layers may comprise different materials or different composition ratios from each other. The respective thicknesses $t_{s1}$ and $t_{s2}$ of the sub-layers 340a and 340b (e.g., length in the Z direction) may be less than the thickness T1 of the inorganic encapsulation layer 320. For example, in an exemplary embodiment, the respective thicknesses $t_{s1}$ and $t_{s2}$ of the sub-layers 340a and 340b may be about 0.01 times to about 0.1 times (e.g., about 1% to about 10%) as much as the thickness T1 of the inorganic encapsulation layer 320. In some exemplary embodiments, the respective thicknesses $t_{s1}$ and $t_{s2}$ of the sub-layers 340a and 340b may, be 100 Å to 1000 Å, and the thickness T1 of the inorganic encapsulation layer 320 may be a few micrometers (μm).

In some exemplary embodiments, the total thickness T2 of the composite encapsulation layer 340 (e.g., the sum of the respective thicknesses $t_{s1}$ and $t_{s2}$ of each of the sub-layers 340a and 340b) may be less than the thickness T1 of the inorganic encapsulation layer 320. Respective thicknesses of the sub-layers 340a and 340b included in the composite encapsulation layer 340 may be very small and may be densely formed, and accordingly, although the composite encapsulation layer 340 includes the plurality of sub-layers 340a and 340b, the total thickness T2 of the composite encapsulation layer 340 may be less than the thickness T1 of the single layer inorganic encapsulation layer 320.

In an exemplary embodiment, the plurality of sub-layers 340a and 340b of the composite encapsulation layer 340 may include organic-inorganic hybrid material. For example, the plurality of sub-layers 340a and 340b may include silicon oxide including carbon or silicon oxide including carbon and hydrogen. For example, the plurality of sub-layers 340a and 340b may include a material having a composition formula of $SiO_xC_yH_z$, wherein x>0, y>0, z≥0. As a composition ratio of x increases, the plurality of sub-layers 340a and 340b may have qualities similar to an inorganic film, and as a composition ratio of y increases, the plurality of sub-layers 340a and 340b may have qualities similar to an organic film.

In some exemplary embodiments, a first sub-layer 340a may have a composition which provides qualities similar to an inorganic film, and a second sub-layer 340b may have a composition which provides qualities similar to an organic film. In this case, the first sub-layer 340a and the second sub-layer 340b may be alternately stacked on each other.

When one first sub-layer 340a and one second sub-layer 340b are stacked on each other (e.g., in the Z direction), the composite encapsulation layer 340 is referred to as including one dyad of sub-layers. In some exemplary embodiments, the composite encapsulation layer 340 may include 1.5 dyads to 10 dyads. FIGS. 2 and 3 show the composite encapsulation layer 340 arranged in 2.5 dyads, FIG. 4A shows the composite encapsulation layer 340 arranged in 1.5 dyads, and FIG. 4B shows the composite encapsulation layer 340 arranged in 10 dyads.

Referring to the exemplary embodiment of FIG. 3, the composite encapsulation layer 340 includes a total of five sub-layers sequentially stacked on one another (e.g., in the Z direction) comprising the first sub-layer 340a/the second sub-layer 340b/the first sub-layer 340a/the second sub-layer 340b/the first sub-layer 340a. This embodiment of the composite encapsulation layer 340 is a structure having layers stacked in 2.5 dyads. In this regard the first sub-layer 340a may include an organic-inorganic hybrid material having qualities of an inorganic film, or an inorganic film. The second sub-layer 340b may include an organic-inorganic hybrid material having qualities of an organic film, or an organic film. In the exemplary embodiment of FIG. 3, a top layer of the composite encapsulation layer 340 is the first sub-layer 340a, which may effectively prevent penetration of moisture.

Referring to the exemplary embodiment of FIG. 4A, the composite encapsulation layer 340 includes a total of three sub-layers sequentially stacked on one another (e.g., in the Z direction) comprising the first sub-layer 340a/the second sub-layer 340b/the first sub-layer 340a. This embodiment of the composite encapsulation layer 340 is a structure having layers stacked in 1.5 dyads.

Referring to the exemplary embodiment of FIG. 4B, the composite encapsulation layer 340 has a stack structure comprising the first sub-layer 340a/the second sub-layer 340b that is repeated 10 times. This embodiment of the composite encapsulation layer 340 is a structure having layers stacked in 10 dyads. When the sub-layers 340a and 340b include a plurality of layers, it may not be necessary for the uppermost layer thereof to be an organic film to prevent the penetration of moisture.

In an exemplary embodiment, when the plurality of sub-layers 340a and 340b include an organic-inorganic hybrid material $SiO_xC_yH_z$, the plurality of sub-layers 340a and 340b may be formed by PECVD. For example, a source gas may be hexamethyldisiloxane, and a reaction gas may be $N_2O$.

For example, when hexamethyldisiloxane is used as a source gas and $N_2O$ having a low flow rate is used at low power, hexamethyldisiloxane may be formed into $SiO_xC_yH_z$ having qualities of an organic film.

When hexamethyldisiloxane is used as a source gas and $N_2O$ having a high flow rate is used at high power, hexamethyldisiloxane may be deposited as $SiO_x$ having qualities of an inorganic film.

In another exemplary embodiment, the first sub-layer 340a of the composite encapsulation layer 340 may include an inorganic film such as silicon oxide ($SiO_2$), silicon nitride ($SiN_x$), silicon oxynitride (SiON), etc., and the second sub-layer 340b may include an organic-inorganic hybrid material having qualities similar to an organic film. For example, the second sub-layer 340b may include $SiO_xC_yH_z$ in which a composition ratio of y is high.

In this embodiment, the first sub-layer 340a may be formed by atomic layer deposition (ALD). Accordingly, the first sub-layer 340a may have a nano-scale thickness and may have a dense structure.

Respective thicknesses of the plurality of sub-layers 340a and 340b may be about 10 nm (100 Å) to about 1000 nm. In some exemplary embodiments, the thickness $t_{s1}$ of the first sub-layer 340a may be less than the thickness $t_{s1}$ of the second sub-layer 340b. In another exemplary embodiment, the thickness $t_{s1}$ of the first sub-layer 340a may be substantially the same as the thickness $t_{s2}$ of the second sub-layer 340b.

As described above, the thin film encapsulation layer 300 of a display apparatus according to an exemplary embodiment of the present inventive concepts includes the composite encapsulation layer 340 having a small modulus and the buffer encapsulation layer 310 which decreases a step. Therefore, a crack in the thin film encapsulation layer 300 may be prevented during a shape change of the display apparatus.

Figure 6:
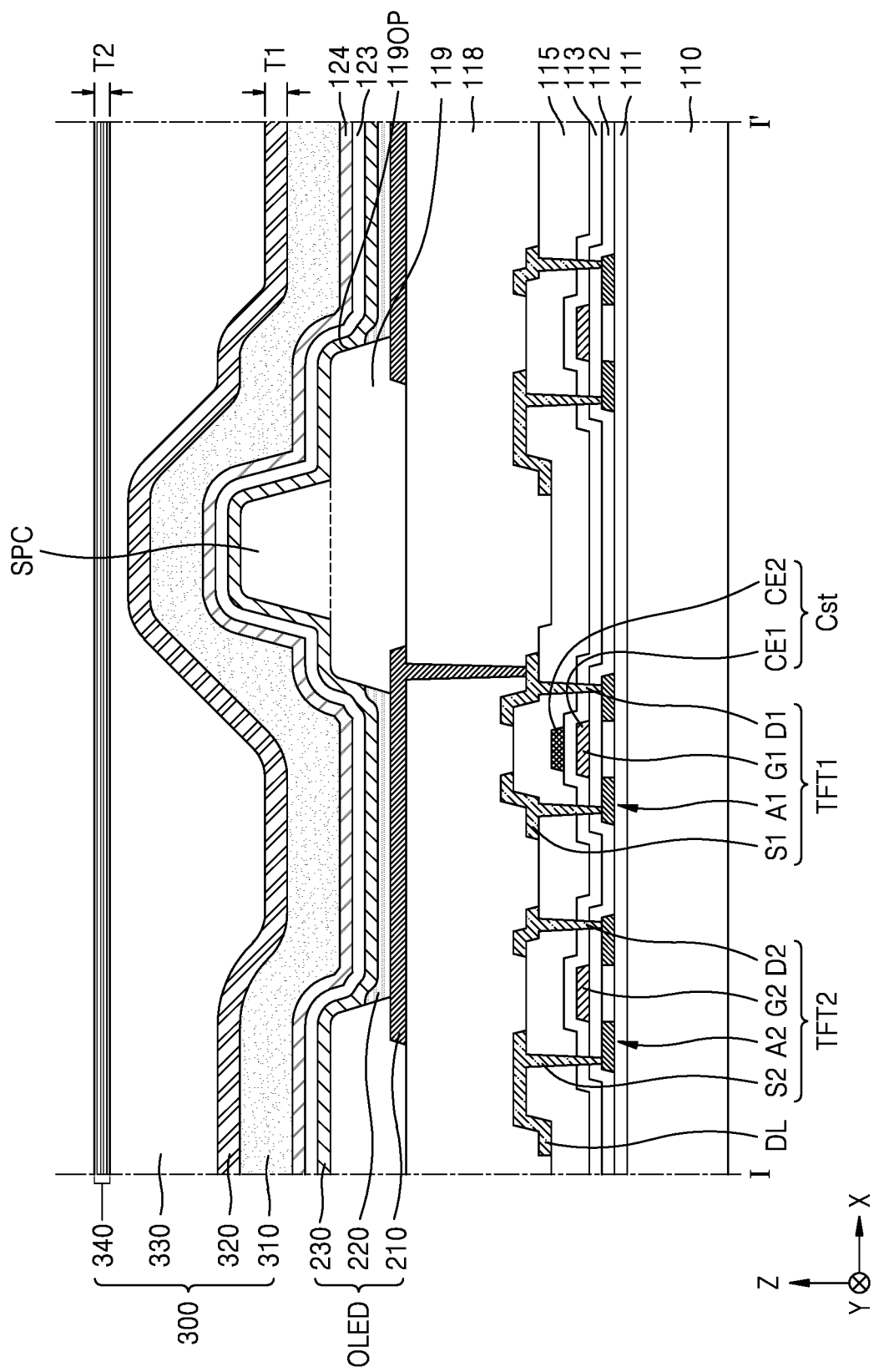
FIG. 6 is a cross-sectional view of a display apparatus taken along line I-I' of FIG. 1 according to another exemplary embodiment of the present inventive concepts.

FIG. 6 is a schematic cross-sectional view of a display apparatus according to another exemplary embodiment of the present inventive concepts. In FIG. 6, elements that are the same as those in FIG. 2 are designated by the same reference numerals, and thus, a repeated description thereof is omitted.

Referring to the exemplary embodiment of FIG. 6, a display apparatus includes the substrate 110, the organic light-emitting diode OLED arranged above the substrate 110 and serving as a display element, the spacer SPC, and the thin film encapsulation layer 300. The thin film encapsulation layer 300 may include the buffer encapsulation layer 310, the inorganic encapsulation layer 320, the organic encapsulation layer 330, and the composite encapsulation layer 340.

The composite encapsulation layer 340 may include a plurality of sub-layers stacked on each other (e.g., in the Z direction). Each of the plurality of sub-layers has a thickness (e.g., length in the Z direction) that is less than the thickness T1 of the inorganic encapsulation layer 320. In an exemplary embodiment, a thickness of each of the plurality of sub-layers may be approximately tens to hundreds of nanometers (e.g., about 10 nm to about 200+ nm). In an exemplary embodiment, some of the plurality of sub-layers may include an organic-inorganic hybrid material.

A modulus (e.g., a bending modulus) of the composite encapsulation layer 340 may be less than the modulus of the inorganic encapsulation layer 320. For example, a modulus of the composite encapsulation layer 340 may be about 0.05 times to about 0.2 times (e.g., about 5% to about 20%) as much as the modulus of the inorganic encapsulation layer 320. In an exemplary embodiment, a modulus of the composite encapsulation layer 340 may be about 6 GPa to about 1.0 GPa. A modulus of the inorganic encapsulation layer 320 may be about 60 GPa to about 100 GPa.

The buffer encapsulation layer 310 may be arranged between the spacer SPC and the inorganic encapsulation layer 320 (e.g., in the Z direction) and decreases a step formed by the spacer SPC. In an exemplary embodiment, the buffer encapsulation layer 310 may include an organic-inorganic hybrid material. For example, the buffer encapsulation layer 310 may include silicon oxide including carbon or silicon oxide including carbon and hydrogen. The buffer encapsulation layer 310 may have qualities of an organic film and thus may have a slope that is gentler (e.g., smaller) than a slope of the spacer SPC.

The thin film encapsulation layer 300 of a display apparatus according to the present embodiment includes the composite encapsulation layer 340 having a small modulus and the buffer encapsulation layer 310 decreasing a step, and thus, a crack in the thin film encapsulation layer 300 may be prevented during a shape change of the display apparatus.

In the exemplary embodiment shown in FIG. 6, a protection layer 124 may be further arranged on the capping layer 123. For example, as shown in the exemplary embodiment of FIG. 6, a bottom surface of the protection layer 124 may directly contact a top surface of the capping layer 123 and a top surface of the protection layer 124 may directly contact a bottom surface of the buffer encapsulation layer 310. The protection layer 124 may prevent damage to the organic light-emitting diode OLED, etc. during a process of forming the thin film encapsulation layer 300, which will be formed on the protection layer 124, and may also increase the light extraction efficiency for light emitted by the organic light-emitting diode OLED.

In an exemplary embodiment, the protection layer 124 may include an inorganic material and may have a refractive index that is less than the refractive index of the capping layer 123. A refractive index of the protection layer 124 may be about 1.35 to about 1.45. As described above, when the protection layer 124 has a small refractive index, light generated in the organic light-emitting diode OLED may be prevented from being substantially absorbed or reflected while being externally emitted, and thus, light extraction efficiency of the display apparatus may increase. In an exemplary embodiment, the protection layer 124 may include lithium fluoride (LiF).

Figure 7:
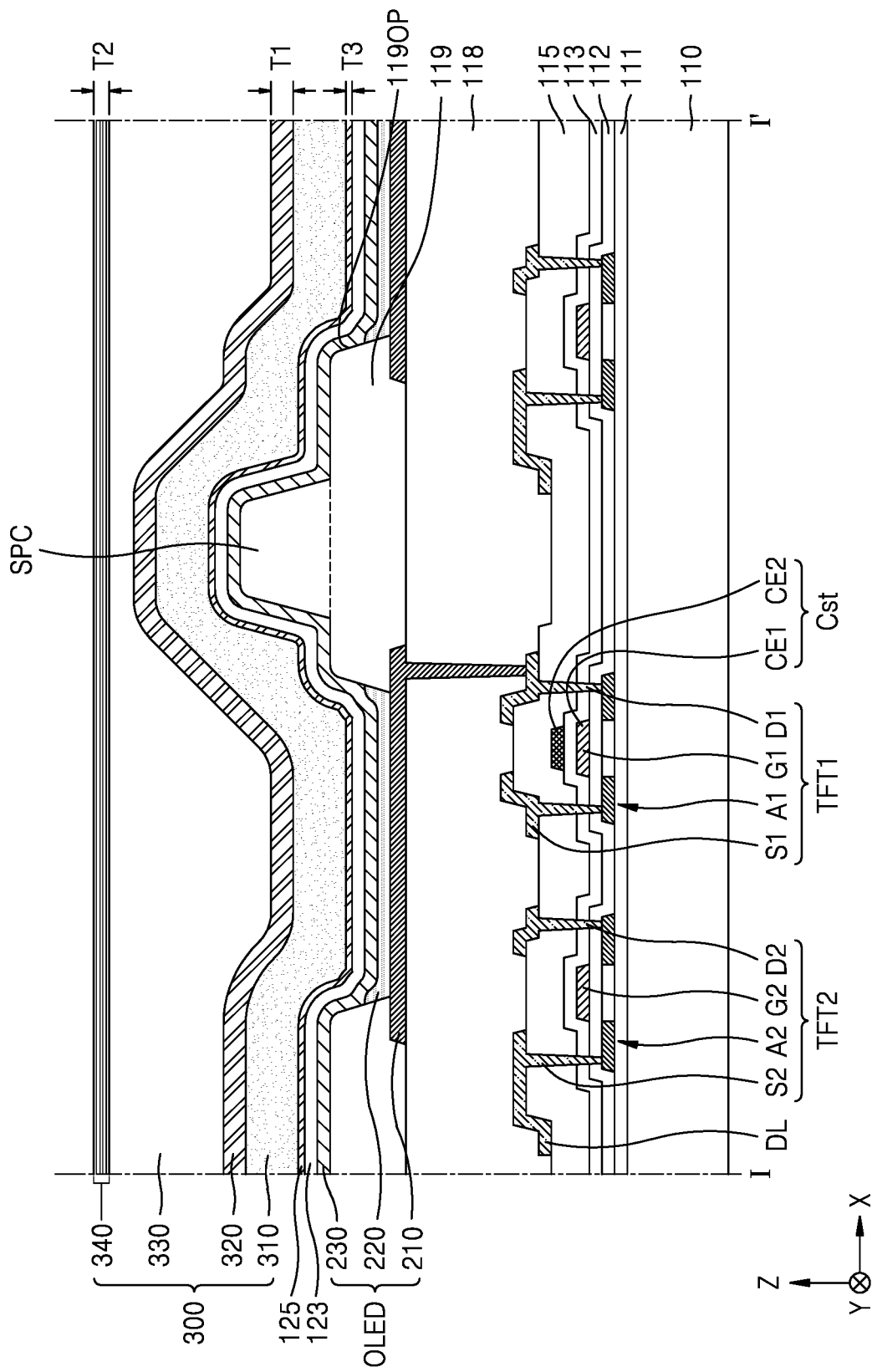
FIG. 7 is a cross-sectional view of a display apparatus taken along line I-I' of FIG. 1 according to another exemplary embodiment of the present inventive concepts.

FIG. 7 is a schematic cross-sectional view of a display apparatus according to another embodiment of the present inventive concepts. In FIG. 7, elements that are the same as those in FIG. 2 are designated by the same reference numerals, and thus, a repeated description thereof is omitted.

Referring to the exemplary embodiment of FIG. 7, a display apparatus includes the substrate 110, the organic light-emitting diode OLED arranged above the substrate 110 and serving as a display element, the spacer SPC, and the thin film encapsulation layer 300. The thin film encapsulation layer 300 may include the buffer encapsulation layer 310, the inorganic encapsulation layer 320, the organic encapsulation layer 330, and the composite encapsulation layer 340.

The composite encapsulation layer 340 may include a plurality of sub-layers stacked on each other (e.g., in the Z direction). Each of the plurality of sub-layers has a thickness (e.g., length in the Z direction) that is less than the thickness T1 of the inorganic encapsulation layer 320. A thickness of each of the plurality of sub-layers may be approximately tens to hundreds of nanometers (e.g., about 10 nm to about 200+ nm). In an exemplary embodiment, some of the plurality of sub-layers may include an organic-inorganic hybrid material.

A modulus (e.g., a bending modulus) of the composite encapsulation layer 340 may be less than that of the inorganic encapsulation layer 320. For example, a modulus of the composite encapsulation layer 340 may be about 0.05 times to about 0.2 times (e.g., about 5% to about 20%) as much as the modulus of the inorganic encapsulation layer 320. In an exemplary embodiment, a modulus of the composite encapsulation layer 340 may be about 6 GPa to about 10 GPa. A modulus of the inorganic encapsulation layer 320 may be about 60 GPa to about 100 GPa.

The buffer encapsulation layer 310 may be arranged between the spacer SPC and the inorganic encapsulation layer 320 (e.g., in the Z direction) and decreases a step formed by the spacer SPC. In an exemplary embodiment, the buffer encapsulation layer 310 may include an organic-inorganic hybrid material. For example, the buffer encapsulation layer 310 may include silicon oxide including carbon or silicon oxide including carbon and hydrogen. The buffer encapsulation layer 310 may have qualities of an organic film and thus may have a slope gentler than that of the spacer SPC.

The thin film encapsulation layer 300 of a display apparatus according to the present embodiment includes the composite encapsulation layer 340 having a small modulus and the buffer encapsulation layer 310 decreasing a step, and thus, a crack in the thin film encapsulation layer 300 may be prevented during a shape charge of the display apparatus.

As shown in the exemplary embodiment of FIG. 7, an inorganic barrier layer 125 may be further arranged between the organic light-emitting diode OLED and the buffer encapsulation layer 310 (e.g., in the Z direction). For example, as shown in the exemplary embodiment of FIG. 7, a bottom surface of the inorganic barrier layer 125 may directly contact a top surface of the capping layer 123 and a top surface of the inorganic barrier layer 125 may directly contact a bottom surface of the buffer encapsulation layer 310. The inorganic barrier layer 125 may be introduced to prevent out-gas that is generated in the buffer encapsulation layer 310 from penetrating into the organic light-emitting diode OLED.

In an exemplary embodiment, the inorganic barrier layer 125 may include at least one compound selected from silicon oxide ($SiO_x$), silicon nitride ($SiN_x$) and silicon oxynitride (SiON). In an exemplary embodiment the inorganic barrier layer 125 may be very thinly and densely formed by ALD.

For example, a thickness T3 of the inorganic barrier layer 125 (e.g., a length in the Z direction) may be less than the thickness T1 of the inorganic encapsulation layer 320. In an exemplary embodiment, the thickness T3 of the inorganic barrier layer 125 may be about 500 Å to about 1000 Å. When the inorganic barrier layer 125 is thick, a modulus thereof may increase, and thus, stress may be concentrated thereon. Accordingly, the inorganic barrier layer 125 may be formed thin to prevent stress from being concentrated thereon.

Figure 8:
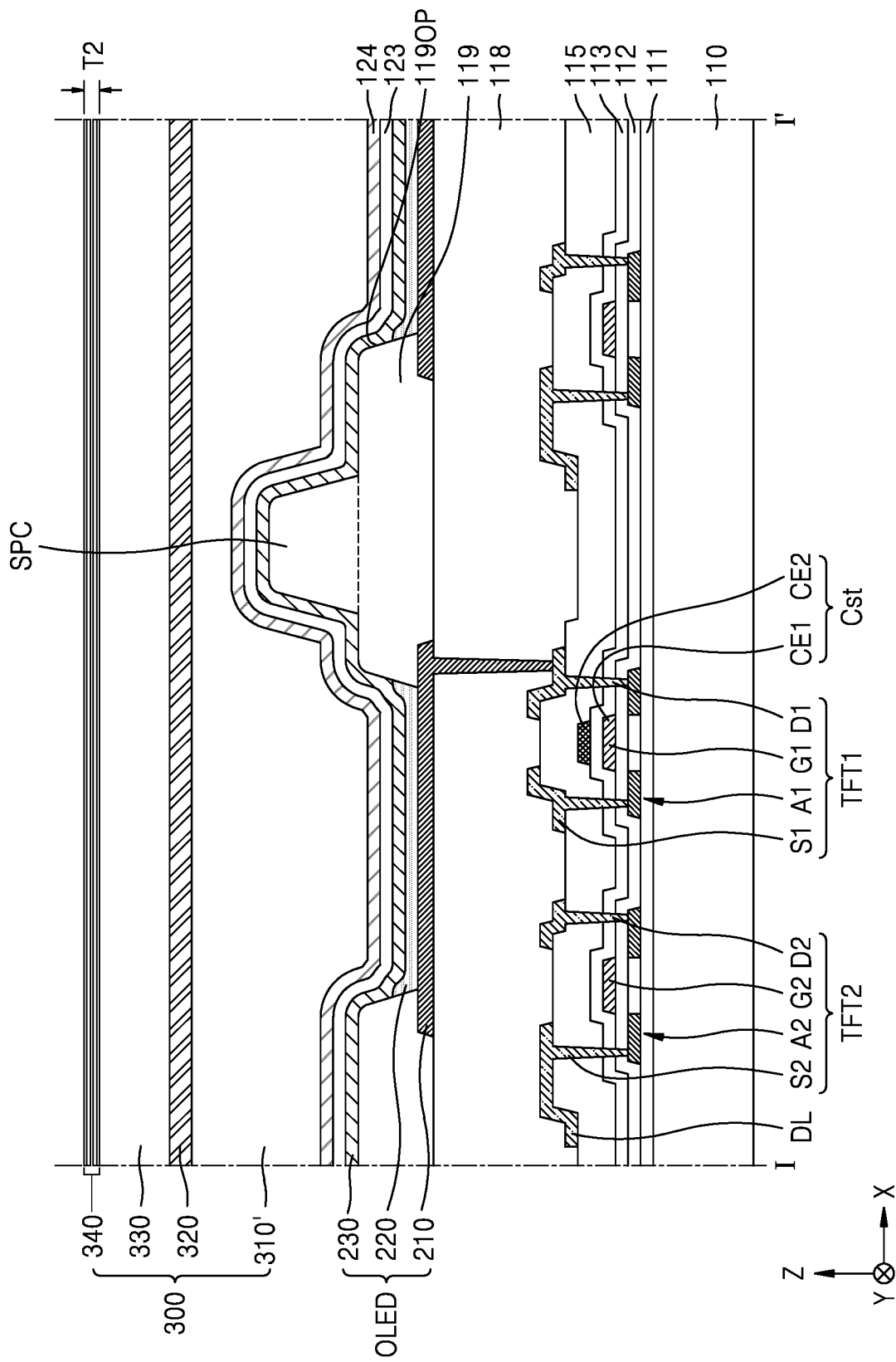
FIG. 8 is a cross-sectional view of a display apparatus taken along line I-I' of FIG. 1 according to another exemplary embodiment of the present inventive concepts.

FIG. 8 is a schematic cross-sectional view of a display apparatus according to another exemplary embodiment of the present inventive concepts. In FIG. 8, elements that are the same as those in FIG. 2 are designated by the same reference numerals, and thus, a repeated description thereof is omitted.

Referring to the exemplary embodiment of FIG. 8, a display apparatus includes the substrate 110, the organic light-emitting diode OLED arranged above the substrate 110 and serving as a display element, the spacer SPC, and the thin film encapsulation layer 300. The thin film encapsulation layer 300 may include a buffer encapsulation layer 310', the inorganic encapsulation layer 320, the organic encapsulation layer 330, and the composite encapsulation layer 340.

The composite encapsulation layer 340 may include a plurality of sub-layers stacked on each other (e.g., in the Z direction), Each of the plurality of sub-layers has a thickness (e.g., length in the Z direction) that is less than the thickness T1 of the inorganic encapsulation layer 320. In an exemplary embodiment, a thickness of each of the plurality of sub-layers may be approximately tens to hundreds of nanometers (e.g., about 10 nm to about 200+ nm). In an exemplary embodiment, some of the plurality of sub-layers may include an organic-inorganic hybrid material.

A modulus (e.g., a bending modulus) of the composite encapsulation layer 340 may be less than the modulus of the inorganic encapsulation layer 320. For example, a modulus of the composite encapsulation layer 340 may be about 0.05 times to about 0.2 times (e.g., about 5% to about 20%) as much as the modulus of the inorganic encapsulation layer 320. In an exemplary embodiment, a modulus of the composite encapsulation layer 340 may be about 6 GPa to about 10 GPa. A modulus of the inorganic encapsulation layer 320 may be about 60 GPa to about 100 GPa.

The buffer encapsulation layer 310' may be arranged between the spacer SPC and the inorganic encapsulation layer 320 (e.g., in the Z direction) and decreases a step formed by the spacer SPC. In an exemplary embodiment, the buffer encapsulation layer 310 may include an organic-inorganic hybrid material. Alternatively, the buffer encapsulation layer 310' may include an organic material. For example, the buffer encapsulation layer 310' may include at least one material selected from the group including acrylic, methacrylic, polyester, polyethylene, polypropylene, PET, polyethylene naphthalate, polycarbonate, polyimide, polyethylene sulfonate, polyoxymethylene, and polyarylate.

In the exemplary embodiment shown in FIG. 8, an upper surface of the buffer encapsulation layer 310 may be flat (e.g., extending generally in the X direction). In an exemplary embodiment in which the buffer encapsulation layer 310' includes an organic-inorganic hybrid material, fluidity may increase as the buffer encapsulation layer 310' has qualities similar to an organic film, and thus, an upper surface thereof may be flat. In an exemplary embodiment in which the buffer encapsulation layer 310' includes an organic material, the buffer encapsulation layer 310' may be formed by applying and then hardening a liquid organic material, and thus, an upper surface thereof may be flat.

The thin film encapsulation layer 300 of a display apparatus according to the present embodiment includes the composite encapsulation layer 340 having a small modulus and the buffer encapsulation layer 310' decreasing a step, and thus, the occurrence of a crack in the thin film encapsulation layer 300 during a shape change of the display apparatus may be prevented.

As shown in the exemplary embodiment of FIG. 8, a protection layer 124 including an inorganic material may be arranged under the buffer encapsulation layer 310'. For example, the protection layer 124 may be arranged between the capping layer 123 and the buffer encapsulation layer 310' (e.g., in the Z direction). For example, a bottom surface of the protection layer 124 may directly contact a top surface of the capping layer 123 and a top surface of the protection layer may directly contact a lower surface of the buffer encapsulation layer 310'.

The protection layer 124 may increase light extraction efficiency of light emitted by the organic light-emitting diode OLED and may also prevent out-gas that is generated in the buffer encapsulation layer 310' from penetrating into the organic light-emitting diode OLED.

In an exemplary embodiment, the protection layer 124 may include an inorganic material and may have a refractive index that is less than the refractive index of the capping layer 123. For example, a refractive index of the protection layer 124 may be about 1.35 to about 1.45. As described above, when the protection layer 124 has a refractive index that is less than the refractive index of the capping layer 123, light generated in the organic light-emitting diode OLED may be prevented from becoming substantially absorbed or reflected while being externally emitted, and thus, light extraction efficiency of the display apparatus may increase.

In an exemplary embodiment, the protection layer 124 may include lithium fluoride (LiF). The protection layer 124 includes an inorganic material, and thus, even when the buffer encapsulation layer 310' includes an organic material, the protection layer 124 may block out-gas that is generated in the organic material.

Figure 9:
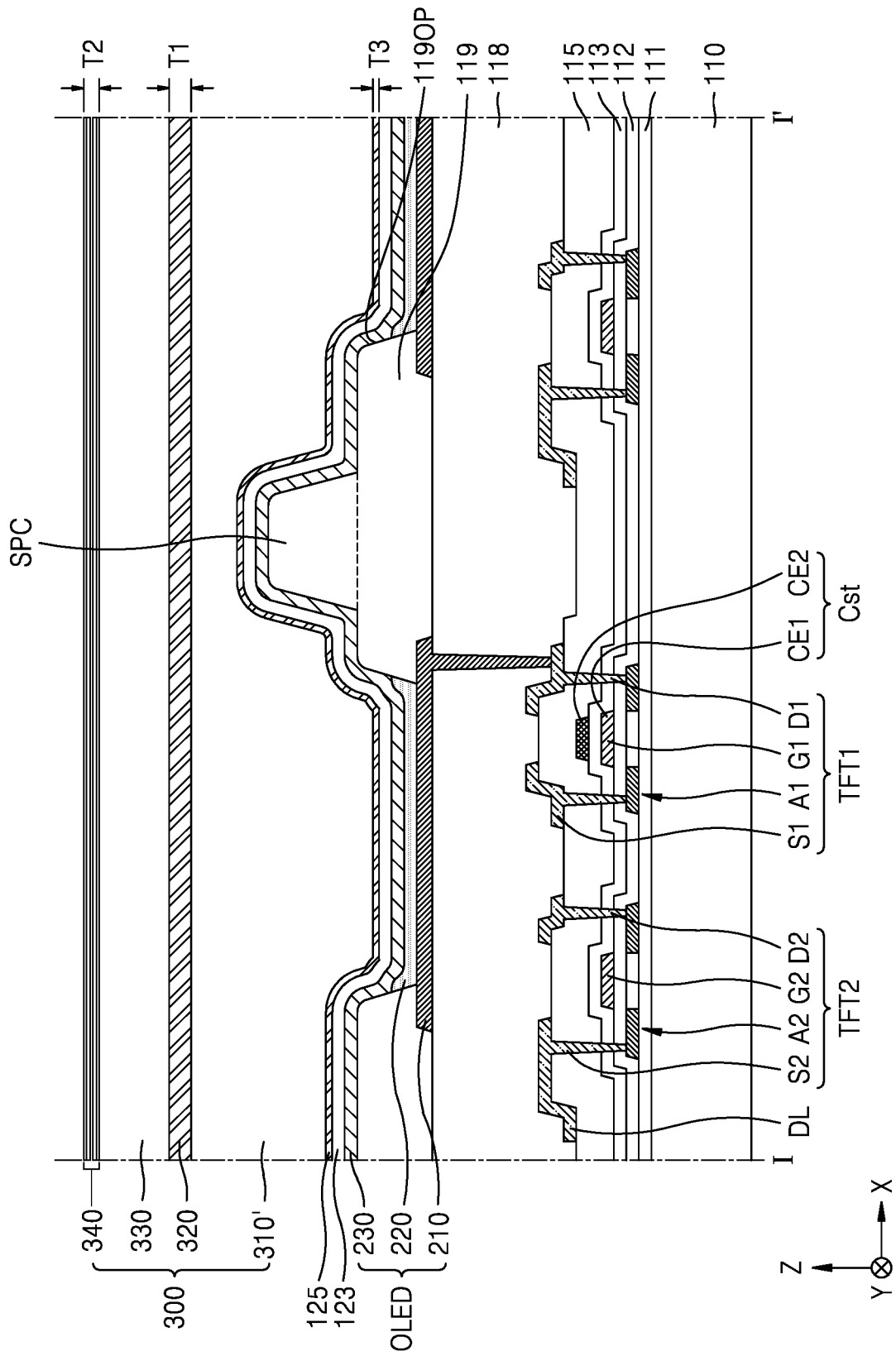
FIG. 9 is a cross-sectional view of a display apparatus taken along line I-I' of FIG. 1 according to another exemplary embodiment of the present inventive concepts.

FIG. 9 is a schematic cross-sectional view of a display apparatus according to another exemplary embodiment of the present inventive concepts. In FIG. 9, elements that are the same as those in FIG. 2 are designated by the same reference numerals, and thus, a repeated description thereof is omitted.

Referring to the exemplary embodiment of FIG. 9, a display apparatus includes the substrate 110, the organic light-emitting diode OLED arranged above the substrate 110 and serving as a display element, the spacer SPC, and the thin film encapsulation layer 300. The thin film encapsulation layer 300 may include the buffer encapsulation layer 310', the inorganic encapsulation layer 320, the organic encapsulation layer 330, and the composite encapsulation layer 340.

The composite encapsulation layer 340 may include a plurality of sub-layers stacked on each other (e.g., in the Z direction). Each of the plurality of sub-layers has a thickness (e.g., length in the Z direction) that is less than the thickness T1 of the inorganic encapsulation layer 320. In an exemplary embodiment, a thickness of each of the plurality of sub-layers may be approximately tens to hundreds of nanometers (e.g., about 10 nm to about 200+ nm). In an exemplary embodiment, some of the plurality of sub-layers may include an organic-inorganic hybrid material.

A modulus (e.g., a bending modulus) of the composite encapsulation layer 340 may be less than the modulus of the inorganic encapsulation layer 320. For example, a modulus of the composite encapsulation layer 340 may be about 0.05 times to about 0.2 times (e.g., about 5% to about 20%) as much as the modulus of the inorganic encapsulation layer 320. In an exemplary embodiment, a modulus of the composite encapsulation layer 340 may be about 6 GPa to about 10 GPa. A modulus of the inorganic encapsulation layer 320 may be about 60 GPa to about 100 GPa.

The buffer encapsulation layer 310' may be arranged between the spacer SPC and the inorganic encapsulation layer 320 (e.g., in the Z direction) and decreases a step formed by the spacer SPC. In an exemplary embodiment, the buffer encapsulation layer 310' may include an organic-inorganic hybrid material. Alternatively, the buffer encapsulation layer 310' may include an organic material. For example, the buffer encapsulation layer 310' may include at least one material selected from the group including acrylic, methacrylic, polyester, polyethylene, polypropylene, PET, polyethylene naphthalate, polycarbonate, polyimide, polyethylene sulfonate, polyoxymethylene, and polyarylate.

In the exemplary embodiment of FIG. 9, an upper surface of the buffer encapsulation layer 310' may be flat (e.g., extending generally in the X direction). In an exemplary embodiment in which the buffer encapsulation layer 310' includes an organic-inorganic hybrid material, fluidity may increase as the buffer encapsulation layer 310' has qualities similar to an organic film, and thus, an upper surface thereof may be flat. In an exemplary embodiment in which the buffer encapsulation layer 310' includes an organic material, the buffer encapsulation layer 310' may be formed by applying and then hardening a liquid organic material, and thus, an upper surface thereof may be flat.

The thin film encapsulation layer 300 of a display apparatus according to the present embodiment includes the composite encapsulation layer 340 having a small modulus and the buffer encapsulation layer 310' decreasing a step, and thus, the occurrence of a crack in the thin film encapsulation layer 300 may be prevented during a shape change of the display apparatus.

As shown in the exemplary embodiment of FIG. 9, an inorganic barrier layer 125 may be further arranged between the organic light-emitting diode OLED and the buffer encapsulation layer 310' (e.g., in the Z direction). For example, a bottom surface of the inorganic barrier layer 125 may directly contact a top surface of the capping layer 123 and a top surface of the inorganic barrier layer 125 may directly contact a bottom surface of the buffer encapsulation layer 310'. The inorganic barrier layer 125 may be introduced to prevent out-gas able that is generated in the buffer encapsulation layer 310' from penetrating into the organic light-emitting diode OLED.

In an exemplary embodiment, the inorganic barrier layer 125 may include at least one compound selected from silicon oxide ($SiO_x$), silicon nitride ($SiN_x$) and silicon oxynitride (SiON). The inorganic barrier layer 125 may be very thinly and densely formed by ALD.

For example, the thickness T3 of the inorganic barrier layer 125 may be less than the thickness T1 of the inorganic encapsulation layer 320. In an exemplary embodiment, the thickness T3 of the inorganic barrier layer 125 may be about 500 Å to about 1000 Å. When the inorganic barrier layer 125 is thick, a modulus thereof may increase, and thus, stress may concentrate thereon. Accordingly, the inorganic barrier layer 125 may be formed thin to prevent a concentration of stress thereon.

Although the present description has been given with reference to one or more exemplary embodiments illustrated in the accompanying drawings, this is merely an example, and it will be understood by those of ordinary skill in the art that various changes therefrom and changes in the exemplary embodiments may be made.

For example, the protection layer 124 described with reference to FIG. 6 and the inorganic barrier layer 125 described with reference to FIG. 7 may be applied simultaneously. Also, the composite encapsulation layer 340 described with reference to FIGS. 4A and 4B may be applied to FIGS. 2, 6, 7, 8, 9, etc.

According to one or more of the above-described exemplary embodiments, a buffer encapsulation layer may be used, and thus, flexibility may be obtained and concentration of stress on an inorganic encapsulation layer may also be prevented. However, exemplary embodiments of the present inventive concepts are not limited by such an effect.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus comprising:
  a substrate including a display area and a peripheral area surrounding the display area;
  display elements arranged in the display area;
  a spacer disposed between the display elements, the spacer including a lateral side having a first slope; and
  a thin film encapsulation layer covering the display area, the thin film encapsulation layer comprising a buffer encapsulation layer, an inorganic encapsulation layer, an organic encapsulation layer, and a composite encapsulation layer sequentially stacked on one another,
  wherein the composite encapsulation layer comprises a plurality of sub-layers stacked on each other, each of the sub-layers has a thickness that is less than a thickness of the inorganic encapsulation layer,
  wherein an upper surface of the buffer encapsulation layer has a second slope that is smaller than the first slope, the second slope overlapping the first slope in a direction of a thickness of the substrate.

2. The display apparatus of claim 1, wherein a modulus of the composite encapsulation layer is less than a modulus of the inorganic encapsulation layer.

3. The display apparatus of claim 2, wherein the modulus of the composite encapsulation layer is in a range of about 5% to about 20% of the modulus of the inorganic encapsulation layer.

4. The display apparatus of claim 1, wherein the buffer encapsulation layer comprises an organic-inorganic hybrid material.

5. The display apparatus of claim 4, wherein the buffer encapsulation layer comprises silicon oxide that includes carbon.

6. The display apparatus of claim 1, wherein:
  1 dyad is a stack structure of a first sub-layer and a second sub-layer, the first sub-layer and the second sub-layer comprising different materials or different composition ratios from each other; and
  the composite encapsulation layer comprises 1.5 dyads to 10 dyads.

7. The display apparatus of claim 1, further comprising:
  a capping layer disposed between the display elements and the thin film encapsulation layer,
  wherein the capping layer comprises a refractive index of about 1.6 to about 3.

8. The display apparatus of claim 1, further comprising an inorganic barrier layer disposed between the display elements and the buffer encapsulation layer,
  wherein the inorganic barrier layer has a thickness that is less than the thickness of the inorganic encapsulation layer.

9. The display apparatus of claim 8, wherein the thickness of the inorganic barrier layer is in a range of about 500 Å to about 1000 Å.

10. A display apparatus comprising:
  a substrate including a display area and a peripheral area surrounding the display area;
  display elements arranged in the display area; and
  a thin film encapsulation layer covering the display area, the thin film encapsulation layer comprising an inorganic encapsulation layer, an organic encapsulation layer, and a composite encapsulation layer sequentially stacked on one another,
  wherein the composite encapsulation layer comprises a plurality of sub-layers stacked on each other and a thickness of the composite encapsulation layer is less than a thickness of the inorganic encapsulation layer,
  wherein at least one sub-layer of the plurality of sub-layers includes an organic-inorganic hybrid material.

11. The display apparatus of claim 10, wherein:
  the thin film encapsulation layer further comprises a buffer encapsulation layer disposed between the display elements and the inorganic encapsulation layer, wherein the buffer encapsulation layer comprises an organic material or an organic-inorganic hybrid material.

12. The display apparatus of claim 11, wherein the buffer encapsulation layer comprises $SiO_xC_yH_z$,
wherein $x>0$, $y>0$, and $z\geq0$.

13. The display apparatus of claim 10, further comprising:
a capping layer disposed between the display elements and the thin film encapsulation layer,
wherein the capping layer comprises a refractive index of about 1.6 to about 3.

14. The display apparatus of claim 13, further comprising:
a protection layer disposed between the capping layer and the thin film encapsulation layer, the protection layer comprising an inorganic material,
wherein a refractive index of the protection layer is less than the refractive index of the capping layer.

15. The display apparatus of claim 10, wherein:
the plurality of sub-layers includes a first sub-layer and a second sub-layer alternately stacked on each other,
wherein the first sub-layer comprises an inorganic film and the second sub-layer comprises an organic-inorganic hybrid material.

16. A flexible display apparatus comprising:
a flexible substrate including a display area and a peripheral area surrounding the display area;
display elements arranged in the display area;
a spacer disposed between the display elements, the spacer including a lateral side having a first slope; and
a thin film encapsulation layer covering the display area, the thin film encapsulation layer including a buffer encapsulation layer disposed above the display area and an inorganic encapsulation layer disposed above the buffer encapsulation layer, the buffer encapsulation layer comprising an organic-inorganic hybrid material;
wherein an upper surface of the buffer encapsulation layer has a second slope that is smaller than the first slope, the second slope overlapping the first slope in a direction of a thickness of the substrate.

* * * * *